United States Patent
Low et al.

(10) Patent No.: US 8,698,288 B1
(45) Date of Patent: Apr. 15, 2014

(54) FLEXIBLE SUBSTRATE WITH CRIMPING INTERCONNECTION

(71) Applicants: Boon Yew Low, Petaling Jaya (MY); Navas Khan Oratti Kalandar, Petaling Jaya (MY); Sharon Huey Lin Tay, Shah Alam (MY)

(72) Inventors: Boon Yew Low, Petaling Jaya (MY); Navas Khan Oratti Kalandar, Petaling Jaya (MY); Sharon Huey Lin Tay, Shah Alam (MY)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 13/901,563

(22) Filed: May 23, 2013

(51) Int. Cl.
*H01L 25/04* (2006.01)
*H01L 25/10* (2006.01)
*H01L 23/14* (2006.01)
*H01L 23/538* (2006.01)
*H01L 23/00* (2006.01)
*H01L 25/11* (2006.01)
*H01L 23/495* (2006.01)

(52) U.S. Cl.
CPC .......... *H01L 23/5381* (2013.01); *H01L 24/11* (2013.01); *H01L 25/117* (2013.01); *H01L 23/14* (2013.01); *H01L 23/49537* (2013.01); *H01L 23/49544* (2013.01); *H01L 23/49575* (2013.01); *H01L 25/043* (2013.01); *H01L 23/5387* (2013.01); *H01L 23/5385* (2013.01); *H01L 23/5389* (2013.01)
USPC ........... 257/668; 257/676; 257/698; 257/727; 257/738; 438/107; 438/126; 438/613

(58) Field of Classification Search
CPC ............................ H01L 23/5387; H01L 23/31
USPC .......... 257/668, 676, 698, 727, 788; 438/107, 438/126
See application file for complete search history.

(56) References Cited

U.S. PATENT DOCUMENTS

| | | | |
|---|---|---|---|
| 4,770,641 A | 9/1988 | Rowlette | |
| 5,247,423 A * | 9/1993 | Lin et al. | 361/719 |
| 5,625,944 A | 5/1997 | Werther | |
| 5,848,837 A * | 12/1998 | Gustafson | 362/235 |
| 6,166,796 A | 12/2000 | Stephenson | |
| 6,226,862 B1 | 5/2001 | Neuman | |
| 6,383,840 B1 | 5/2002 | Hashimoto | |
| 7,732,907 B2 * | 6/2010 | Han et al. | 257/686 |
| 8,129,730 B2 * | 3/2012 | Daniels | 257/88 |
| 8,136,421 B2 | 3/2012 | Kosht | |
| 2004/0164396 A1* | 8/2004 | Hashimoto | 257/690 |
| 2008/0179080 A1* | 7/2008 | Tanaka et al. | 174/254 |

* cited by examiner

*Primary Examiner* — Olik Chaudhuri
*Assistant Examiner* — Nicholas Tobergte
(74) *Attorney, Agent, or Firm* — Charles Bergere

(57) ABSTRACT

A semiconductor device includes first and second flexible substrates each with first and second peripheral edges. First and second dies are attached on respective surfaces of the flexible substrates and are each respectively electrically connected to first and second metal traces. A first crimping structure electrically connects the first metal traces to the second metal traces and crimps together the first peripheral edges of the first and second substrates. A second crimping structure electrically connects the first metal traces to the second metal traces and crimps together the second peripheral edges of the first and second substrates.

16 Claims, 2 Drawing Sheets

FLEXIBLE SUBSTRATE WITH CRIMPING INTERCONNECTION

BACKGROUND OF THE INVENTION

The present invention is directed to a semiconductor device having more than one substrate and a method of making a semiconductor device with interconnections between the substrates made by crimping the peripheral edges of the substrates.

The stacking of multiple semiconductor dies or packages is often limited due to space constraints. Ball-grid array (BGA) type connections, for example, mold array process-BGA (MAPBGA), plastic BGA (PBGA) type, or the like, have size limitations due to form fitting and the thickness of the packages being connected. Flip-chip arrangements allow for better die stacking, but the wafer fabrication cost can be much higher.

It is therefore desirable to provide devices that can be made at low cost with low profiles to allow for stacking and interconnection of multiple dies, substrates, and/or packages.

BRIEF DESCRIPTION OF THE SEVERAL VIEWS OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. Notably, certain vertical dimensions have been exaggerated relative to certain horizontal dimensions.

In the drawings.

DETAILED DESCRIPTION OF THE INVENTION

Figure 1:
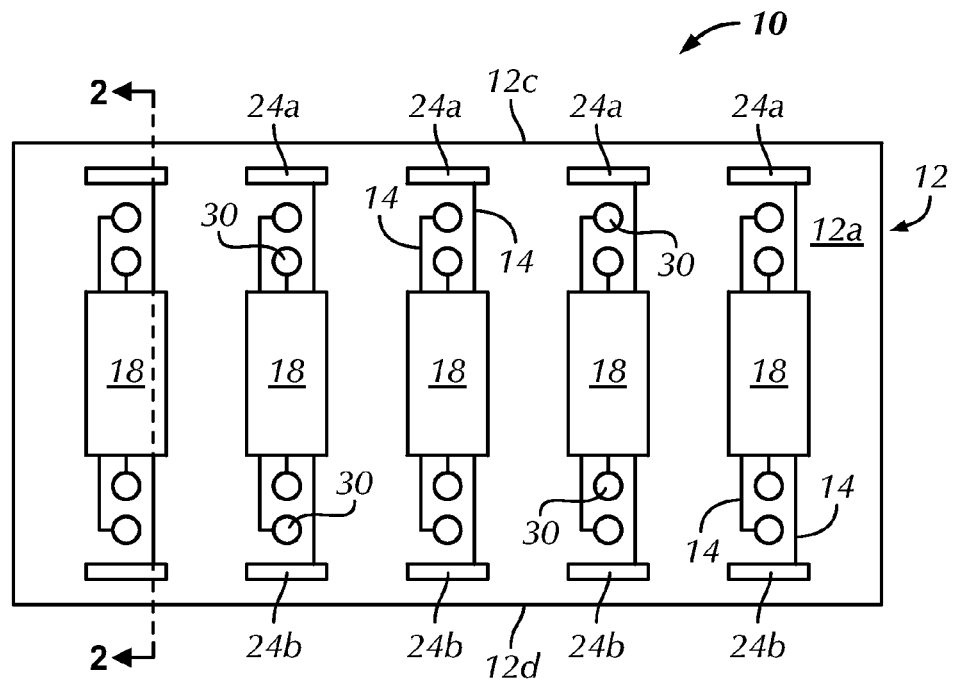
FIG. 1 is a top plan view of a semiconductor device in accordance with an embodiment of the invention.
Figure 2:
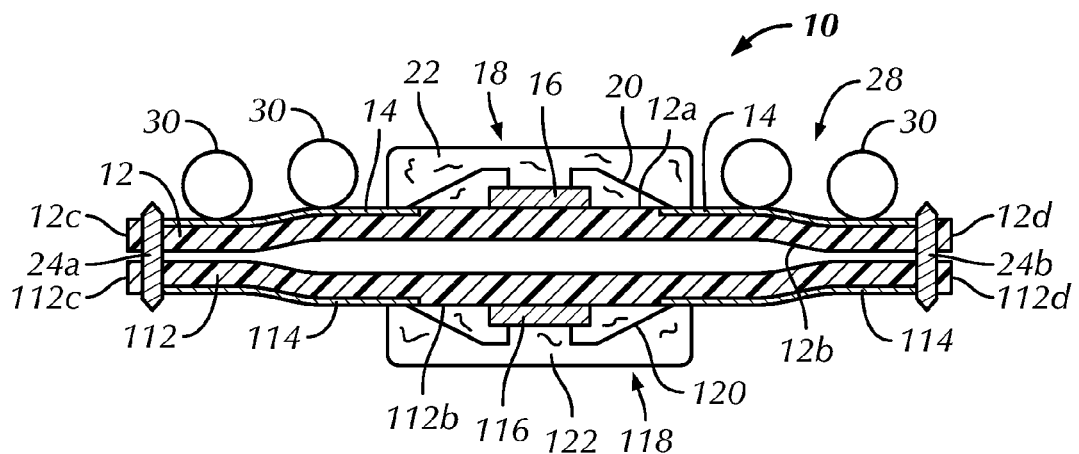
FIG. 2 is an enlarged cross-sectional side elevational view of the semiconductor device of FIG. 1 taken along line 2-2.

Referring to the drawings, wherein the same reference numerals are used to designate the same components throughout the several figures, there is shown in FIGS. 1 and 2 a semiconductor device 10 in accordance with an embodiment of the invention. The device 10 includes a first flexible substrate 12 having opposing first and second main surfaces 12a, 12b extending between first and second peripheral edges 12c, 12d. The first flexible substrate 12 preferably has a thickness in the range of about 0.2 to about 0.4 millimeters (mm), and may be made from flexible materials, such as polyimide, polyether ether ketone (PEEK), polyester, other flexible polymer-based materials, or the like.

A first plurality of metal traces 14 may be formed on the first flexible substrate 12, and may be made from copper or the like. The metal traces 14 are shown in FIG. 1 as being exposed at the first main surface 12a of the first flexible substrate 12. However, the metal traces 14 may also or alternatively be formed on the second main surface 12b, or may be embedded or partially embedded in the first flexible substrate 12.

The first flexible substrate 12 may also be coated with a protective layer (not shown), such as a lacquer-like layer of polymer that can be used to provide a permanent protective coating for the metal traces 14.

At least one first semiconductor die 16 is attached on the first or second main surface 12a, 12b of the first flexible substrate 12. In the embodiment shown in FIGS. 1 and 2, the first semiconductor die 16 is attached to the first main surface 12a, although additional dies may be attached on the opposing second main surface 12b as well.

The first semiconductor die 16 is typically in the form of an integrated circuit (IC) or the like. The first semiconductor die 16 may be made from any semiconductor material or combinations of materials, such as gallium arsenide, silicon germanium, silicon-on-insulator (SOI), silicon, monocrystalline silicon, the like, and combinations of the above. The first semiconductor die 16 is preferably attached to the first main surface 12a of the first flexible substrate 12 by epoxy or a like adhesive, although other methods of attachment, such as solder mounts, welding, mechanical or other fasteners, or the like, may be used as well. The method of attachment is preferably chosen so as to avoid significant impairment of the flexibility of the first flexible substrate 12.

The first semiconductor die 16 preferably forms part of a package 18, as is conventionally known. For example, a plurality of electrical interconnectors 20 are provided to electrically couple the first semiconductor die 16 to the metal traces 14 on the first main surface 12a of the first flexible substrate 12. The electrical interconnectors 20 are preferably in the form of gold wires attached via a wire bonding process to the first main surface 12a of the first flexible substrate 12 and the first semiconductor die 16. Other similar conductive materials or technologies may be used for the wires.

However, other electrical interconnectors 20 may also be used, such as solder balls, conductive pads, through wafer vias, or the like, which would allow the physical mounting of the first semiconductor die 16 on the substrate 12 to also serve as the electrical connection.

The first semiconductor die 16 and the electrical interconnectors 20 are further preferably embedded in a packaging material 22, such as a mold compound, as is conventionally known. The packaging material 22 may be made from a ceramic material, a polymeric material, or the like. The packaging material 22 may alternatively be a liquid dispensed glob top material, such as a polymeric epoxy, or the like.

The device 10 also includes a second flexible substrate 112 having opposing first and second main surfaces 112a, 112b extending between first and second peripheral edges 112c, 112d. The second flexible substrate 112 is much like the first flexible substrate 12, and the description will therefore not be repeated.

A second plurality of metal traces 114, similar to the first plurality of metal traces 14, may be formed on the second flexible substrate 112. Similarly, at least one second semiconductor die 116, much like the first semiconductor die 16, may be attached on the second flexible substrate 112 with electrical connection to the second plurality of metal traces 114.

One difference in the embodiment shown in FIGS. 1 and 2 between the first and second flexible substrates 12, 112 is that the metal traces 114 and the second semiconductor die 116 are formed on the second main surface 112b of the second flexible substrate 112. By orienting the first and second flexible substrates 12, 112 such that the first main surface 112a of the second flexible substrate faces the second main surface 12b of the first flexible substrate 12, the first and second flexible substrates 12, 112 may be in closer proximity to one another once connected, ensuring a more stable coupling. However, other mounting configurations of the first and second semiconductor dies 16, 116 can be used in keeping within the spirit of the invention. For example, the first and second semiconductor dies 16, 116 may face one another in the completed device 10.

The second semiconductor die 116 also preferably forms part of a package 118, including electrical interconnectors 120 and packaging material 122 similar to that of the package 18 containing the first semiconductor die 16.

The first and second flexible substrates 12, 112 are preferably joined, physically and electrically, by crimping structures 24 disposed at the first and second peripheral edges 12c, 12d, 112c, 112d thereof. For example, a first crimping structure 24a may connect one or more of the first plurality of metal traces 14 on the first flexible substrate 12 to one or more corresponding ones of the second plurality of metal traces 114 on the second flexible substrate. The first crimping structure 24a also crimps together the first peripheral edges 12c, 112c of the first and second flexible substrates 12, 112. A second crimping structure 24b performs similar functions at the second peripheral edges 12d, 112d of the first and second flexible substrates 12, 112.

The crimping structures 24 are preferably made of a durable electrically conductive material, such as copper, steel, or the like, which may also be plated with nickel, gold, silver, combinations thereof, or the like. In the embodiment of FIGS. 1 and 2, the crimping structures 24 are in the form of crimping plates that extend through the first and second flexible substrates 12, 112. The crimping plates 24 may be attached by placing a sufficient amount of pressure on the crimping plate 24 to punch through the material of the first and second flexible substrates 12, 112, preferably at a location of one or more of the first and second pluralities of metal traces 14, 114. The pressure may be provided by a conventional crimping tool. The crimping plates 24 may cause bending at the peripheral substrate edges 12c, 12d, 112c, 112d such that the first main surface 112a of the second flexible substrate 112 and the second main surface 12b of the first flexible substrate 12 are closer to one another at the peripheral edges 12c, 12d, 112c, 112d than at the centers where the dies 16, 116 are located. The crimping plates 24 may be sharpened at one or both ends thereof to facilitate puncturing of the material of the first and second flexible substrates 12, 112.

Figure 3:
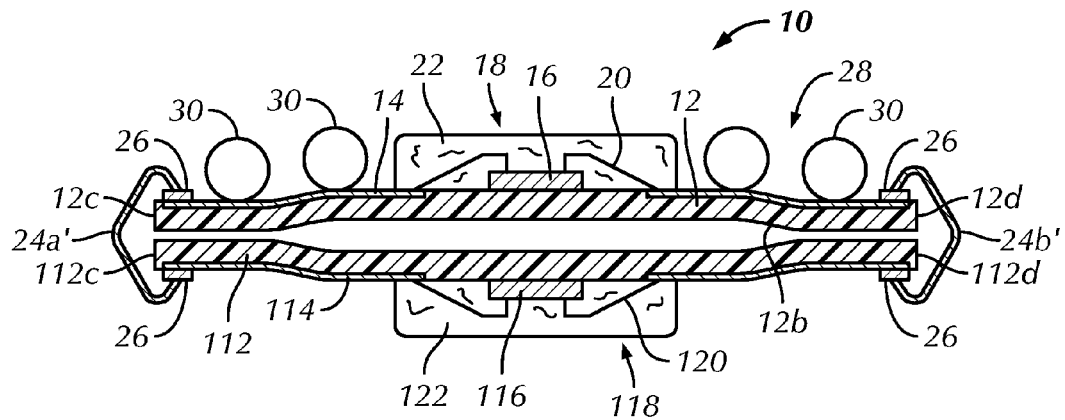
FIG. 3 is an enlarged cross-sectional side elevational view of a semiconductor device in accordance with a second embodiment of the invention.

In a second embodiment shown in FIG. 3, crimping structures 24' in the form of crimping pins are used. Each crimping pin 24' is preferably electrically connected to the first main surface 12a of the first flexible substrate 12 and the second main surface 112b of the second flexible substrate 112. Rather than puncturing the substrates 12, 112, the crimping pins 24' supply sufficient pressure at the peripheral edges 12c, 12d, 112c, 112d of the first and second flexible substrates 12, 112 for a physical connection and to electrically connect the first and second semiconductor dies 16, 116 via the metal traces 14, 114, which are preferably exposed at the points of contact with the crimping pins 24'.

To facilitate adequate electrical connection by the crimping pins 24', pads 26 may be formed on the relevant surface portions of the first and second flexible substrates 12, 112 to which the crimping pins 24' may be coupled. The pads 26 may be made from copper (Cu) and/or other conductive materials, and may be coated, alloyed or pre-plated with a metal layer or layers such as gold (Au), nickel (Ni), palladium (Pd), tin (Sn) or the like.

Figure 4:
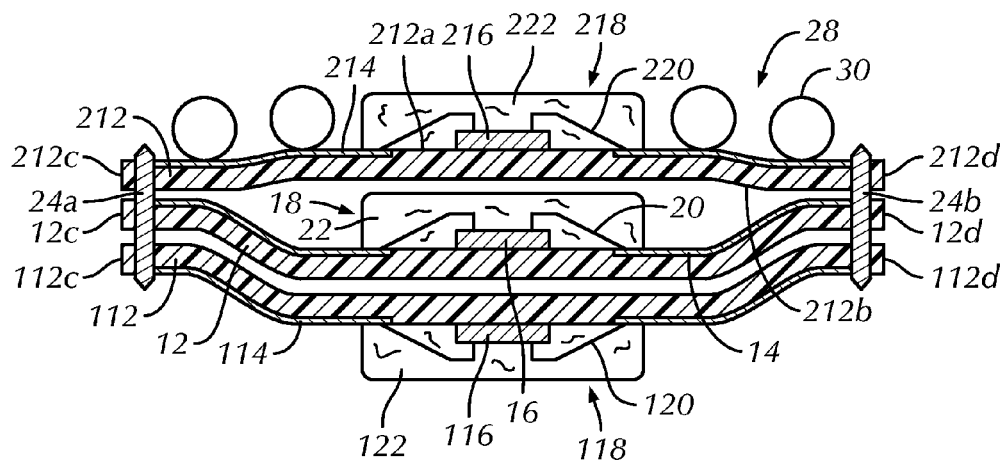
FIG. 4 is an enlarged cross-sectional side elevational view of a semiconductor device in accordance with a third embodiment of the invention.

In another embodiment shown in FIG. 4, additional flexible substrates may be included in the device 10. For example, FIG. 4 shows a third flexible substrate 212 much like the first and second flexible substrates 12, 112, and includes a third plurality of metal traces 214, a third semiconductor die 216, electrical interconnectors 220, and packaging material 222.

In this embodiment, the first, second, and third flexible substrates 12, 112, 212 are crimped together and electrically connected by crimping plates 24 that extend through each of the flexible substrates 12, 112, 212 at the peripheral edges 12c, 12d, 112c, 112d, 212c, 212d thereof. In the configuration of FIG. 4, the third semiconductor die 216 is arranged on the first main surface 212a of the third flexible substrate 212, although mounting on the second main surface 212b thereof is also contemplated.

Referring again to FIG. 1, it is preferred that a plurality of crimping structures 24 be arranged at each of the peripheral edges 12c, 12d, 112c, 112d of the flexible substrates 12, 112. This allows the mounting of multiple dies 16, 116, additional connections between substrates 12, 112, and/or enhanced integrity of the physical connection.

It is further preferred that the device 10 includes a ball grid array (BGA) 28 or like connecting structure (e.g., tape BGA (TBGA), mold array process-BGA (MAPBGA), plastic BGA (PBGA) type, or the like) on one of the first main surface 12a of the first flexible substrate 12 or the second main surface 112b of the second flexible substrate 112 (although in FIG. 4 the BGA 28 is formed on the first main surface 212a of the third flexible substrate 212). The BGA 28 allows for electrical connection and/or mounting to other devices, substrates, printed circuit boards (not shown) or the like. Accordingly, a plurality of solder balls 30 may be used to provide a path for electrical signals between the device 10 and a printed circuit board (PCB) or other device (not shown) to which the device 10 is to be electrically coupled via the solder balls 30.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that boundaries between the above-described operations are merely illustrative. The multiple operations may be combined into a single operation, a single operation may be distributed in additional operations and operations may be executed at least partially overlapping in time. Further, alternative embodiments may include multiple instances of a particular operation, and the order of operations may be altered in various other embodiments.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A semiconductor device, comprising:
a first flexible substrate having opposing first and second main surfaces extending between first and second peripheral edges, at least one first die being attached on one of the first or second main surfaces of the first flexible substrate in electrical connection with a first plurality of metal traces formed on the first flexible substrate;
a second flexible substrate having opposing first and second main surfaces extending between first and second peripheral edges, at least one second die being attached on one of the first or second main surfaces of the second flexible substrate in electrical connection with a second plurality of metal traces formed on the second flexible substrate, the second flexible substrate being oriented such that one of the main surfaces thereof faces one of the main surfaces of the first flexible substrate;
a first crimping structure electrically connecting at least one of the first plurality of metal traces to at least one of the second plurality of metal traces and crimping together the first peripheral edges of the first and second flexible substrates; and
a second crimping structure electrically connecting at least one of the first plurality of metal traces to at least one of the second plurality of metal traces and crimping together the second peripheral edges of the first and second flexible substrates.

2. The device of claim 1, wherein the first and second crimping structures are crimping plates extending through each of the first and second flexible substrates.

3. The device of claim 2, further comprising:
a third flexible substrate having opposing first and second main surfaces extending between first and second peripheral edges, at least one third die being attached on one of the first or second main surfaces of the third flexible substrate in electrical connection with a third plurality of metal traces formed on the third flexible substrate, the third flexible substrate being oriented such that one of the main surfaces thereof faces one of the main surface of the first flexible substrate,
wherein the first crimping plate extends through the first, second, and third substrates, electrically connects at least one of the first, second, and third pluralities of metal traces to each other, and crimps together the first peripheral edges of the first, second, and third flexible substrates, and
wherein the second crimping plate extends through the first, second, and third substrates, electrically connects at least one of the first, second, and third pluralities of metal traces to each other, and crimps together the second peripheral edges of the first, second, and third flexible substrates.

4. The device of claim 1, wherein the first and second crimping structures are crimping pins each connected to one of the main surfaces of the first flexible substrate and one of the main surfaces of the second flexible substrate.

5. The device of claim 4, wherein the first and second flexible substrates each include electrical pads to which the respective first and second crimping pins are electrically connected.

6. The device of claim 1, further comprising:
a plurality of the first crimping structures, each electrically connecting at least one of the first plurality of metal traces to at least one of the second plurality of metal traces and crimping together the first peripheral edges of the first and second flexible substrates; and
a plurality of the second crimping structures, each electrically connecting at least one of the first plurality of metal traces to at least one of the second plurality of metal traces and crimping together the second peripheral edges of the first and second flexible substrates.

7. The device of claim 1, wherein the second main surface of the first flexible substrate faces the first main surface of the second flexible substrate, and
wherein the at least one first die is attached on the first main surface of the first flexible substrate and the at least one second die is attached on the second main surface of the second flexible substrate.

8. The device of claim 1, wherein the second main surface of the first flexible substrate faces the first main surface of the second flexible substrate, and
the device further comprises a ball grid array formed on one of the first main surface of the first flexible substrate or the second main surface of the second flexible substrate.

9. The device of claim 1, wherein the at least one first die and the at least one second die are each encapsulated in a packaging material.

10. A method of assembling a semiconductor device, the method comprising:
attaching at least one first die on one of a first main surface or an opposing second main surface of a first flexible substrate, the first and second main surfaces of the first flexible substrate extending between first and second peripheral edges thereof;
electrically connecting the at least one first die to a first plurality of metal traces formed on the first flexible substrate;
attaching at least one second die on one of a first main surface or an opposing second main surface of a second flexible substrate, the first and second main surfaces of the second flexible substrate extending between first and second peripheral edges thereof;
electrically connecting the at least one second die to a second plurality of metal traces formed on the second flexible substrate;
orienting the second flexible substrate such that one of the main surfaces thereof faces one of the main surfaces of the first flexible substrate;
crimping together the first peripheral edges of the first and second flexible substrates with a first crimping structure that electrically connects at least one of the first plurality of metal traces to at least one of the second plurality of metal traces; and
crimping together the second peripheral edges of the first and second flexible substrates with a second crimping structure that electrically connects at least one of the first plurality of metal traces to at least one of the second plurality of metal traces.

11. The method of claim 10, wherein the first and second crimping structures are crimping plates, and crimping the first and second peripheral edges includes penetrating the first and second substrates with first and second crimping plates.

12. The method of claim 11, further comprising:
attaching at least one third die on one of a first main surface or an opposing second main surface of a third flexible substrate, the first and second main surfaces of the third flexible substrate extending between first and second peripheral edges thereof;

electrically connecting the at least one third die to a third plurality of metal traces formed on the third flexible substrate; and orienting the third flexible substrate such that one of the main surfaces thereof faces one of the main surfaces of the first flexible substrate, wherein crimping of the first peripheral edges further includes penetrating the third flexible substrate with the first crimping plates to crimp together the first peripheral edges of the first, second, and third flexible substrates and electrically connect at least one of the first, second, and third pluralities of metal traces to each other, and wherein crimping of the second peripheral edges further includes penetrating the third flexible substrate with the second crimping plates to crimp together the second peripheral edges of the first, second, and third flexible substrates and electrically connect at least one of the first, second, and third pluralities of metal traces to each other.

13. The method of claim 10, wherein the first and second crimping structures are crimping pins and crimping of the first and second peripheral edges includes connecting each of the first and second crimping pins to one of the main surfaces of the first flexible substrate and one of the main surfaces of the second flexible substrate.

14. The method of claim 13, further comprising forming electrical pads on the first and second flexible substrates to which the first and second crimping pins are respectively electrically connected.

15. The method of claim 10, wherein the second main surface of the first flexible substrate faces the first main surface of the second flexible substrate, the method further comprising:

attaching the at least one first die on the first main surface of the first flexible substrate and attaching the at least one second die on the second main surface of the second flexible substrate.

16. The method of claim 10, wherein the second main surface of the first flexible substrate faces the first main surface of the second flexible substrate, the method further comprising:

forming a ball grid array on one of the first main surface of the first flexible substrate or the second main surface of the second flexible substrate.

* * * * *